US 6,710,658 B2

(12) United States Patent
Griepentrog

(10) Patent No.: US 6,710,658 B2
(45) Date of Patent: Mar. 23, 2004

(54) NON-LINEAR SIGNAL PROCESSOR

(75) Inventor: Dal Frank Griepentrog, Indianapolis, IN (US)

(73) Assignee: Thomson Licensing S.A., Boulogne (FR)

(*) Notice: Subject to any disclaimer, the term of this patent is extended or adjusted under 35 U.S.C. 154(b) by 0 days.

(21) Appl. No.: 10/148,302

(22) PCT Filed: Dec. 1, 2000

(86) PCT No.: PCT/US00/32694

§ 371 (c)(1),
(2), (4) Date: May 29, 2002

(87) PCT Pub. No.: WO01/41303

PCT Pub. Date: Jun. 7, 2001

(65) Prior Publication Data

US 2002/0171491 A1 Nov. 21, 2002

Related U.S. Application Data

(60) Provisional application No. 60/168,280, filed on Dec. 1, 1999.

(51) Int. Cl.[7] ................................................. H03F 3/45
(52) U.S. Cl. ........................ 330/254; 330/258; 330/259
(58) Field of Search ................................ 330/252, 254, 330/258, 259, 261; 348/678, 707

(56) References Cited

U.S. PATENT DOCUMENTS

| 3,742,377 A | | 6/1973 | Dobkin ..................... 330/30 D |
| 5,008,632 A | * | 4/1991 | Sutterlin ................. 330/258 X |
| 5,812,218 A | | 9/1998 | Elbert ........................ 348/678 |
| 6,150,881 A | * | 11/2000 | Lovelace et al. ....... 330/259 X |

OTHER PUBLICATIONS

H. Blom et al "Adaptive Highlight Compression in Today's CCD Cameras" SMPTE Journal, US vol. 101, No. 3, Mar. 1, 1992, pp. 135–139.

Y. Sano et al. "Integrated Wideband Amplifier for Three–Channel Video Signals" Electronics & Communications in Japan, Part II "Electronics", US, vol. 77, No. 6, Jun. 1, 1994, pp. 81–89.

* cited by examiner

Primary Examiner—Steven J. Mottola
(74) Attorney, Agent, or Firm—Joseph S. Tripoli; Robert D. Shedd; William A. Lagoni

(57) ABSTRACT

A signal processor which provides non-linear transfer functions provides a processor output and non-linear inflection points that are referenced to a common bias. The processor output and the non-linear inflection points each exhibit rejection to time variant common-mode variations.

20 Claims, 12 Drawing Sheets

US 6,710,658 B2

NON-LINEAR SIGNAL PROCESSOR

This application claims the benefit under 35 U.S.C. §365 of International Application PCT/US00/32694 dated Dec. 01, 2000, which was published in accordance with PCT Article 21(2) on Jun. 7, 2001 in English; and which claims benefit of U.S. Provisional Application No. 60/168,280, filed Dec. 1, 1999.

FIELD OF THE INVENTION

The present invention relates generally to signal processing systems that process signals non-linearly and, more particularly, to systems that non-linearly process signals in a partially differential configuration.

BACKGROUND OF THE INVENTION

In a signal processing system it is often necessary to provide a non-linear transfer function to amplify portions of the signal dynamic range by different amounts. This non-linear processing is often necessary for one or more reasons. For example, in a video signal processing system, non-linear processing may be used: (1) to improve the subjective appeal of a displayed video image, (2) to compensate for different "gamma" characteristics of cameras and display devices, or (3) to accommodate differing non-linear light output characteristics of the various light output channels of a color video display device.

A common problem in video signal processing systems is pick-up of "noise" signals due to (1) stray electrostatic and/or electromagnetic fields, (2) ground potential differences between stages of the system and (3) supply voltage differences between stages of the system. In a non-linear processing stage, it is also problematic if the bias reference for the signal and the bias reference for the non-linear inflection point thresholds are different, which also adds a form of "noise" to the signal.

In order to minimize stray electrostatic and or electromagnetic pickup in inter-stage connections and/or to minimize ground induced noise due to ground potential differences between circuits in a signal processing system it is often the case that partially differential signaling techniques will be employed, often in connection with twisted pair wiring. In partially differential signaling, one connection will communicate the common-mode bias for the time variant signal communicated on the second connection of the partially differential pair. Subsequent signal processing, such as differential amplifiers, having the capability to reject common-mode variations imposed on the partially differential interconnections, will be employed. It is often the case that portions of the signal processing will be included in an integrated circuit video amplifier (such as the TDA6120Q CRT Driver IC manufactured by Toshiba) wherein the voltage gain is provided by a differential amplifier having an external gain setting emitter degenerating resistor. One example of a particular signal processing system application that may include such an IC and exhibit the described problems is a kinescope driver amplifier in a television system.

SUMMARY OF THE INVENTION

The invention resides, in part, in recognizing the problems described above and, in part, in providing a non-linear signal processing system that solves the problem. Such a system comprises a processor for amplifying a partially differential signal, the partially differential signal comprising a time-variant signal and a common-mode bias, and for rejecting a time-variant common-mode signal imposed upon the partially differential signal; means for establishing a threshold level representative of the common-mode bias; means for altering the gain of said processor in response to a predetermined relationship existing between the time-variant signal and the threshold level; and means for substantially preventing the time-variant common-mode signal from modifying the predetermined relationship.

BRIEF DESCRIPTION OF THE DRAWING

The invention may be better understood by considering the drawing along with the detailed description below. In the drawing.

Figure 1:
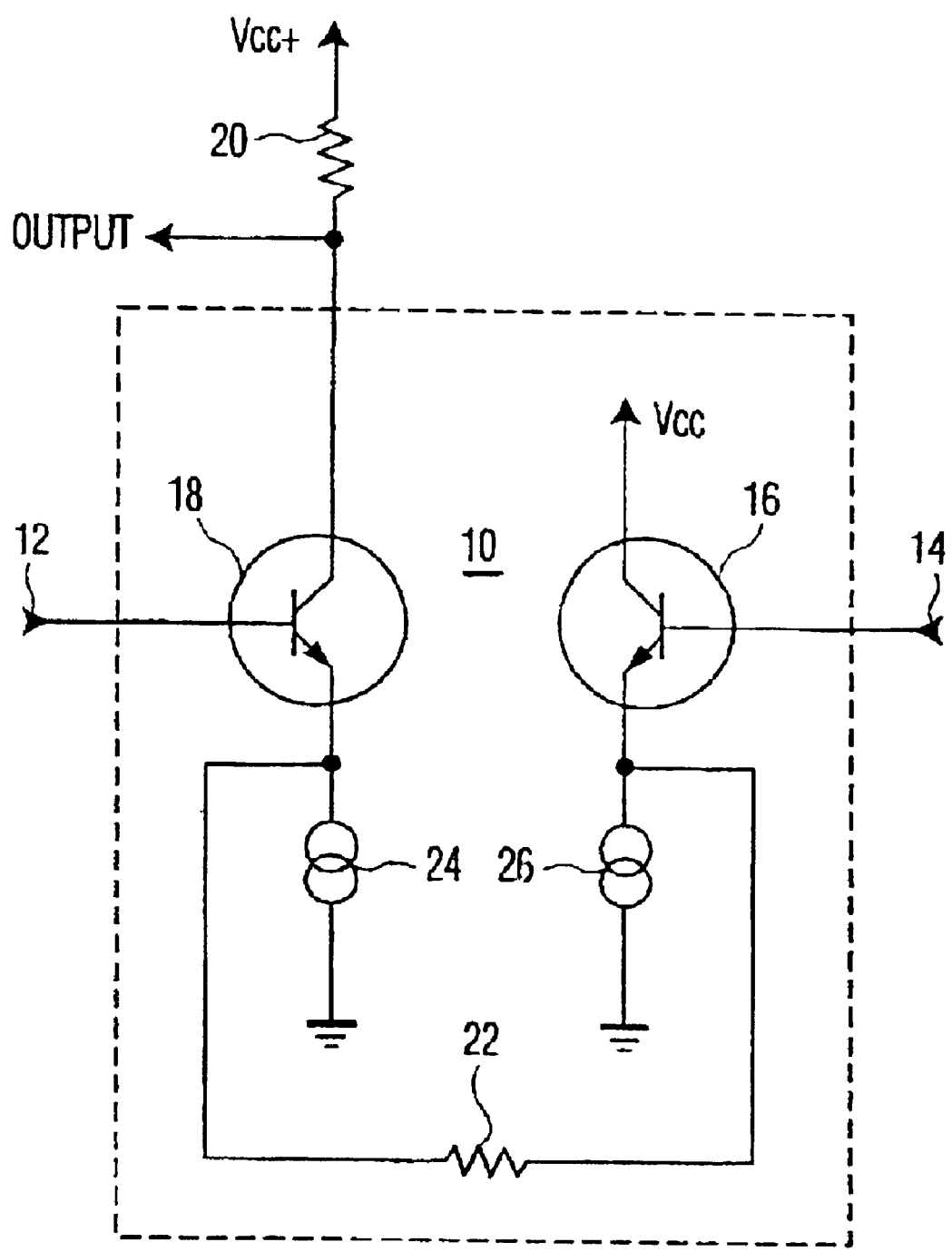
FIG. 1 shows, in schematic diagram form, an embodiment of a differential amplifier.

In the Drawing, the use of an identical reference designator in more than one Figure indicates the same or similar features in the Figures.

DETAILED DESCRIPTION

The invention is described below in the context of an exemplary embodiment involving a television signal processing system. However, the invention may be applicable to other types of signal processing systems.

A signal processing systems such as television signal processing system typically includes apparatus for amplifying voltage signals, for example either a demodulated luminance signal or component color signals. Providing a non-linear gain characteristic for the amplifier is often desirable. As shown in FIG. 1, it is often the case that a differential amplifier 10 is used, wherein one input 12 to amplifier 10 contains the desired time variant signal and the other input 14 provides the common-mode bias for amplifier 10. It is also common that a time variant common-mode component will reside on each of these two input signals. In the circuit of FIG. 1 the common-mode bias 14 is applied to the base of transistor 16, and the time variant input signal 12 is applied to the base of transistor 18 of amplifier 10. The gain of amplifier 10 is determined by the ratio of resistor 20 to resistor 22. Current sources 24 and 26 are included in amplifier 10 to provide operating current for the amplifier and to improve its common-mode rejection ratio.

Figure 2:
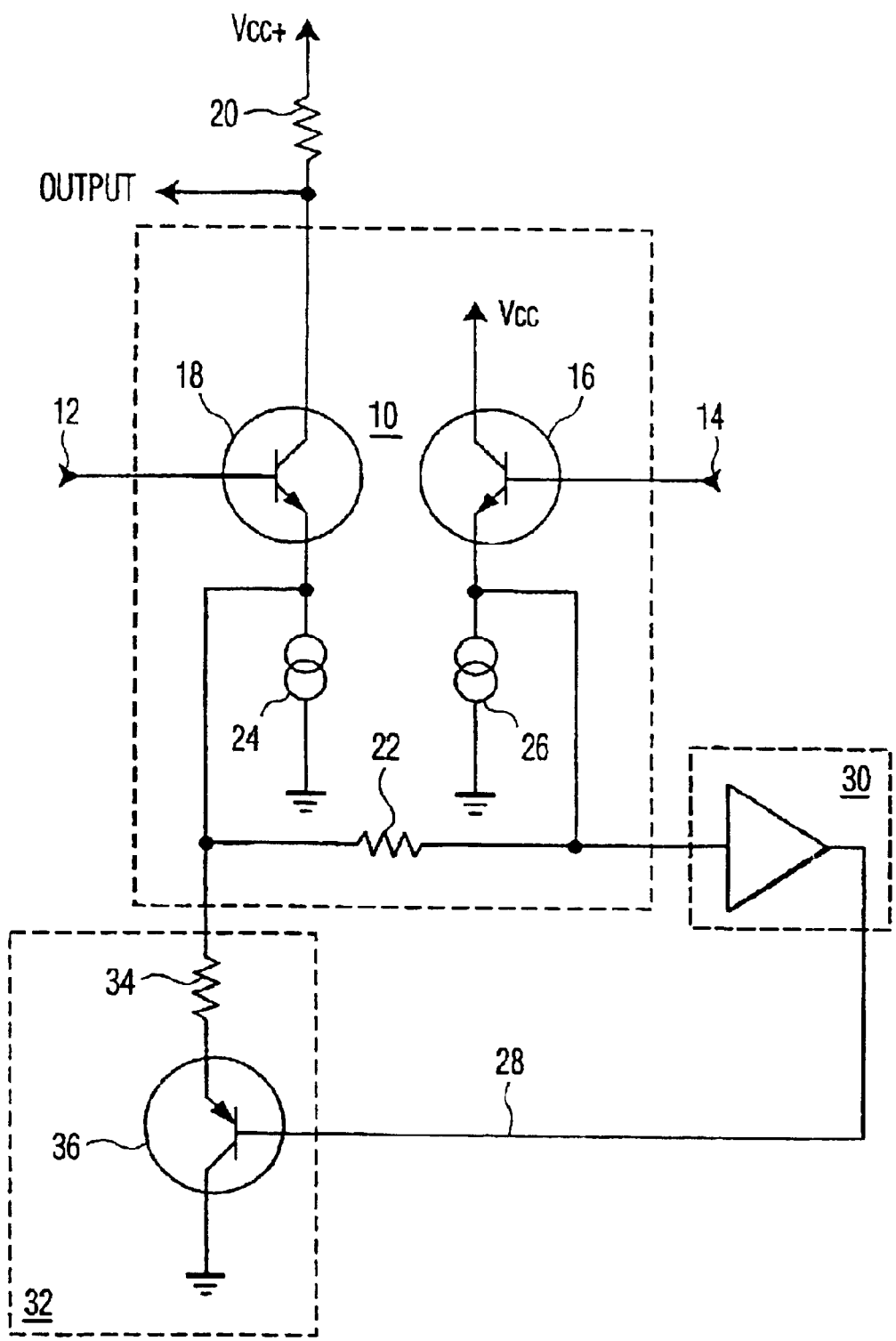
FIG. 2 shows, in schematic diagram form, a signal processing system having two gain regions with an inflection point at the input common-mode bias point and the gain in the second gain region being higher than the gain in the first region.

When it is desired to provide a non-linear characteristic to an amplifier so constructed, an approach to providing, in common, both a DC bias for the amplification and the non-linear gain circuitry is required. The circuit of FIG. 2 derives a threshold value signal 28 through buffer 30, the threshold value signal 28 bearing a predetermined relationship to the common-mode bias. The threshold value signal 28 comprises a DC component related to the common-mode bias and possibly some time variant common-mode component. The threshold value signal 28 produced by the circuit shown in FIG. 2 can be used to bias a non-linear network 32 comprising transistor 36 and secondary gain setting resistor 34. Non-linear network 32 is configured such that the time variant common-mode signal which is applied to the inputs of amplifier 10 is buffered and appears between the emitter of transistor 18 and the base of transistor 36. The common-mode bias signal 14 applied to transistor 16 is buffered by buffer 30 and also appears between transistor 18 emitter and transistor 36 base. Because conduction of transistor 36 is determined by forward bias of its base to emitter junction, the threshold of conduction of transistor 36 can be determined to occur at the level of input 12 that corresponds to common-mode bias 14. At levels of time variant signal 12 below threshold value signal 28, when transistor 36 is not conductive, the gain of amplifier 10 is determined by the ratio of resistor 20 to resistor 22. At levels of time variant signal 12 above threshold value signal 28, when transistor 36 is conductive the gain of 10 is determined by the ratio of resistor 20 to the parallel combination of resistors 22 and 34.

Figure 3:
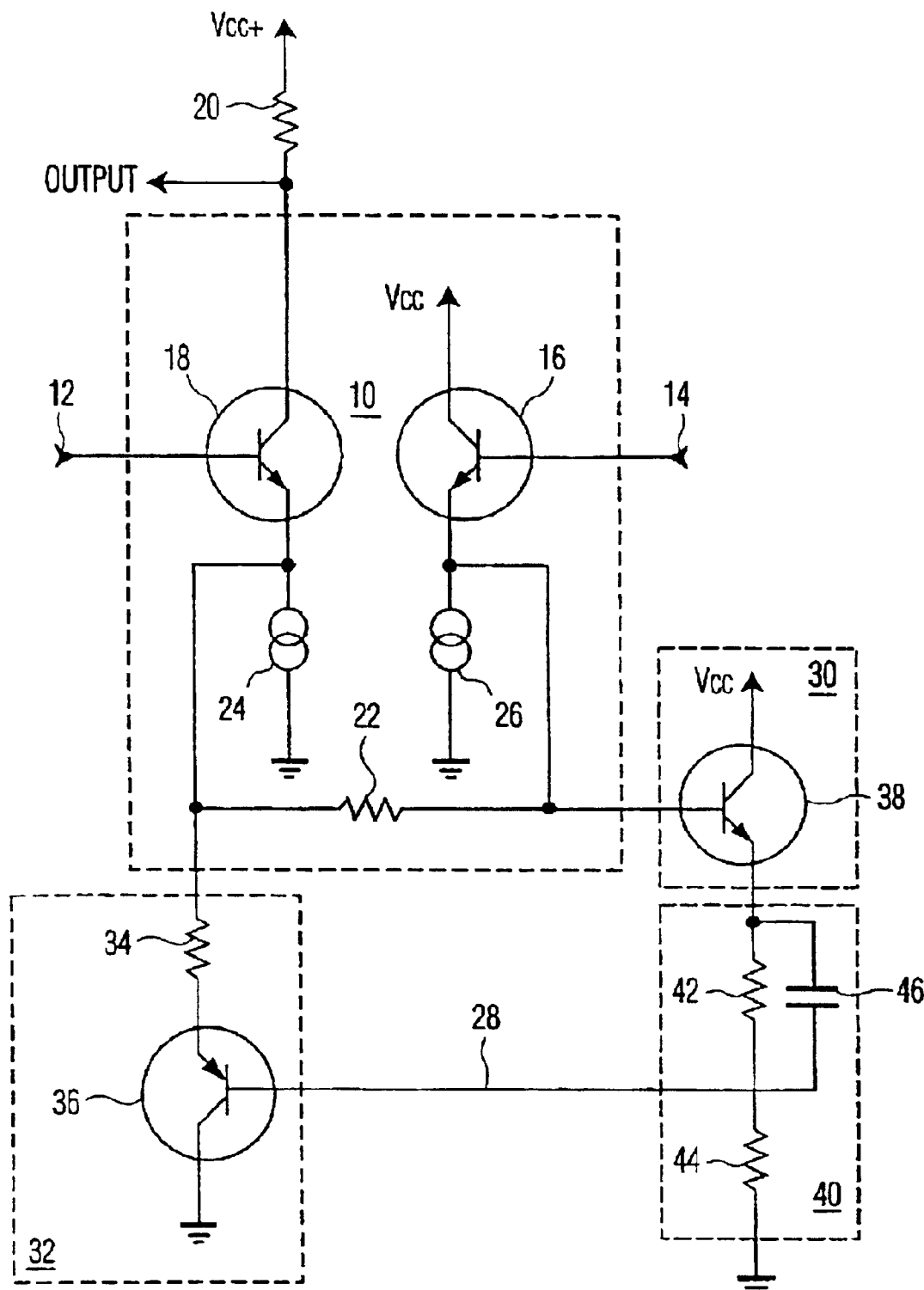
FIG. 3 shows, in schematic diagram form, a signal processing system having two gain regions with an inflection point below the input common-mode bias point and the gain in the second gain region being higher than the gain in the first region.
Figure 4:
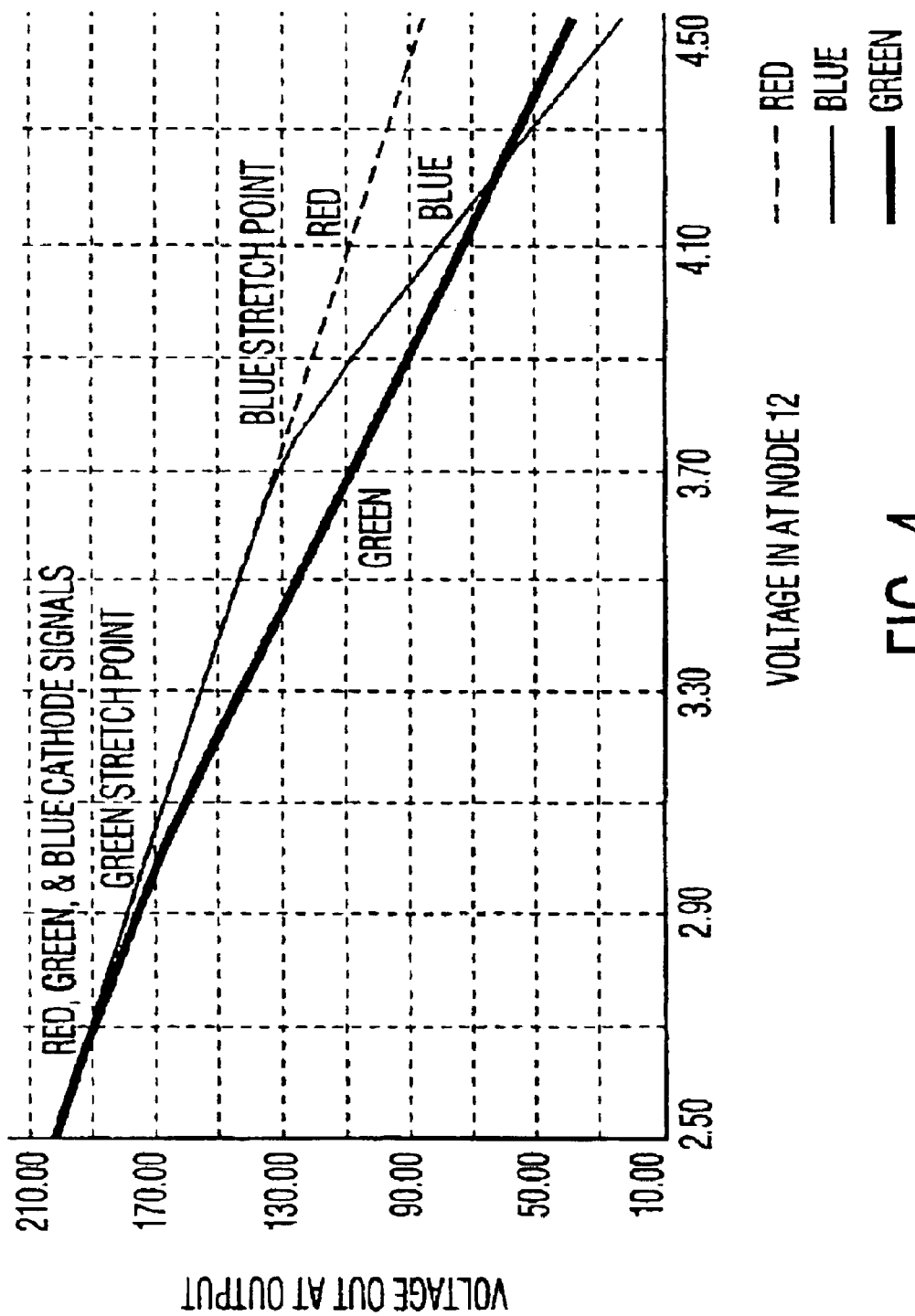
FIG. 4 shows a graph of a characteristic response typical of a system such as that shown in FIG. 3.

In the embodiment shown in FIG. 3, buffer 30 is accomplished with the emitter follower stage comprising transistor 38 which drives divider network 40, comprising a resistive divider formed by resistors 42 and 44 and bypass capacitor 46. In the embodiment of FIG. 3, the threshold value signal is derived at the divider point formed by the junction of resistors 42 and 44. This circuit configuration allows the threshold value to be located at any level within the input signal dynamic range which is below the value of common-mode bias 14. The presence of bypass capacitor 46 causes the time variant common-mode signal to appear un-attenuated at input 28 of non-linear network 32. In this way an amplifier transfer function such as shown in FIG. 4, having relatively higher gain for input signals above a preset threshold, can be obtained. Note that FIG. 3 shows a different transfer function for each of the red, green, and blue channel amplifiers. As is well known, the point at which the amplifier gain changes to provide non-linear processing may be at a different preset level for each channel. Because the time variant common-mode signal is applied directly between transistor 36 base and transistor 18 emitter, it does not alter the conduction threshold of transistor 36. First order temperature compensation of the non-linear inflection point reference is provided by the configuration of the base-emitter junctions of transistors 36 and 38. If the non-linear inflection point is very close to the input common-mode bias 14 level, i.e., resistor 42<<resistor 44, the temperature compensation will be as good as the thermal match between transistors 36 and 38. As the value of resistor 42 increases with respect to resistor 44, the temperature compensation will be less than perfect, but will still have a favorable influence due to transistor 38 base-emitter junction variation as compared to those of transistor 36 base-emitter junction.

Figure 5:
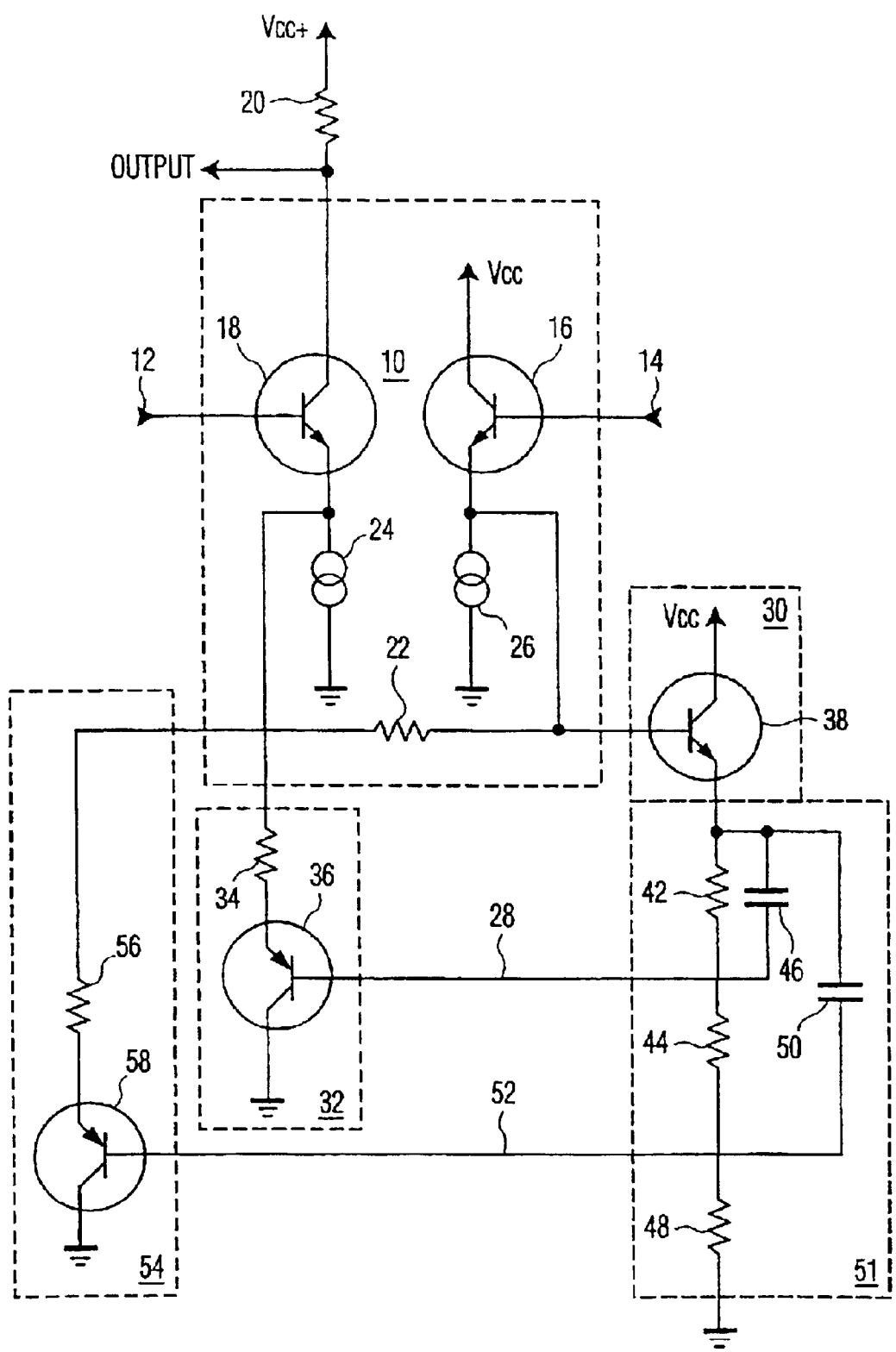
FIG. 5 shows, in schematic diagram form, a signal processing system having three gain regions with two inflection points both below the input common-mode bias point and the gain in the second and third gain regions each being successively higher gain than in the first region.
Figure 6:
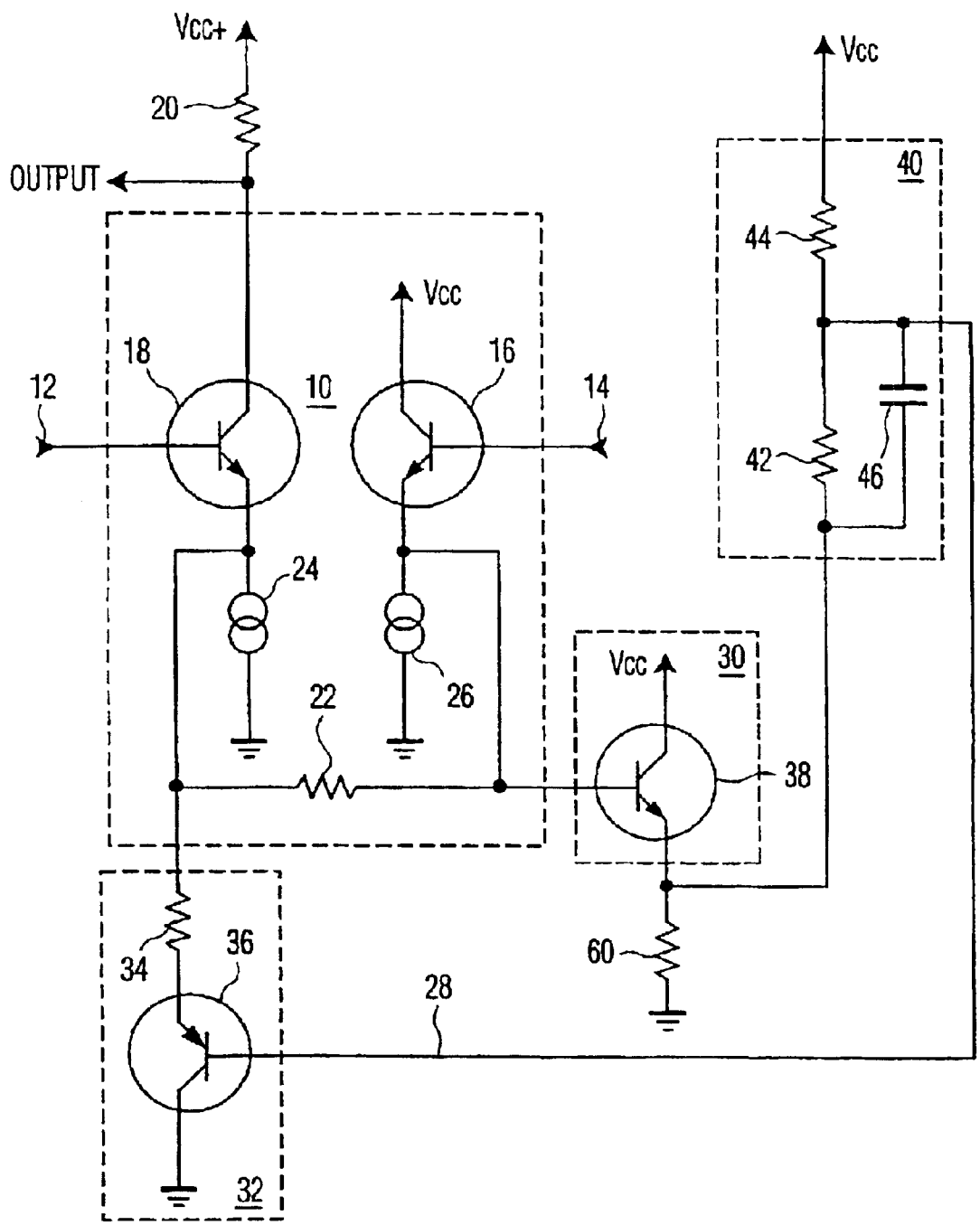
FIG. 6 shows, in schematic diagram form, a signal processing system having two gain regions with an inflection point above the input common-mode bias point and the gain in the second gain region being higher than the gain in the first region.

FIG. 5 shows a signal processing system embodiment similar to that of FIG. 3, but which provides two non-linear inflection points, both of which are at or below the level of the input common-mode bias voltage 14. In the circuit shown in FIG. 5 a divider network 51 is employed, network 51 having an additional threshold value signal 52 developed at the divider point formed by resistors 44 and 48. In this embodiment bypass capacitor 50 is added to assure that the un-attenuated time variant common-mode signal appears at the input 52 to non-linear network 54 comprised of transistor 58 and a second secondary gain setting resistor 56. The three gain regions associated with FIG. 5 occur: (1) when neither transistor 36 nor transistor 58 are conducting and the gain of amplifier 10 is determined by the ratio of resistors 20 and 22, (2) when transistor 58 conducts and the gain of amplifier 10 is determined by the ratio of resistor 20 to resistor 22 in parallel with resistor 56, and (3) when both transistors 36 and 58 are conducting and the gain of amplifier 10 is determined by the ratio of resistor 20 to the parallel combination of resistors 22, 34 and 56.The embodiment in FIG. 6 provides a behavior similar to that of the circuit shown in FIG. 3, but which has a non-linear inflection point which is higher than the input common-mode bias voltage. In the circuit of FIG. 6, divider network 40 is referenced to a positive supply voltage and an emitter load resistor 60 is added to provide bias current for transistor 38 and divider network 40. The gains in the two gain regions are characterized the same as in the description of the circuit in FIG. 3.

Figure 7:
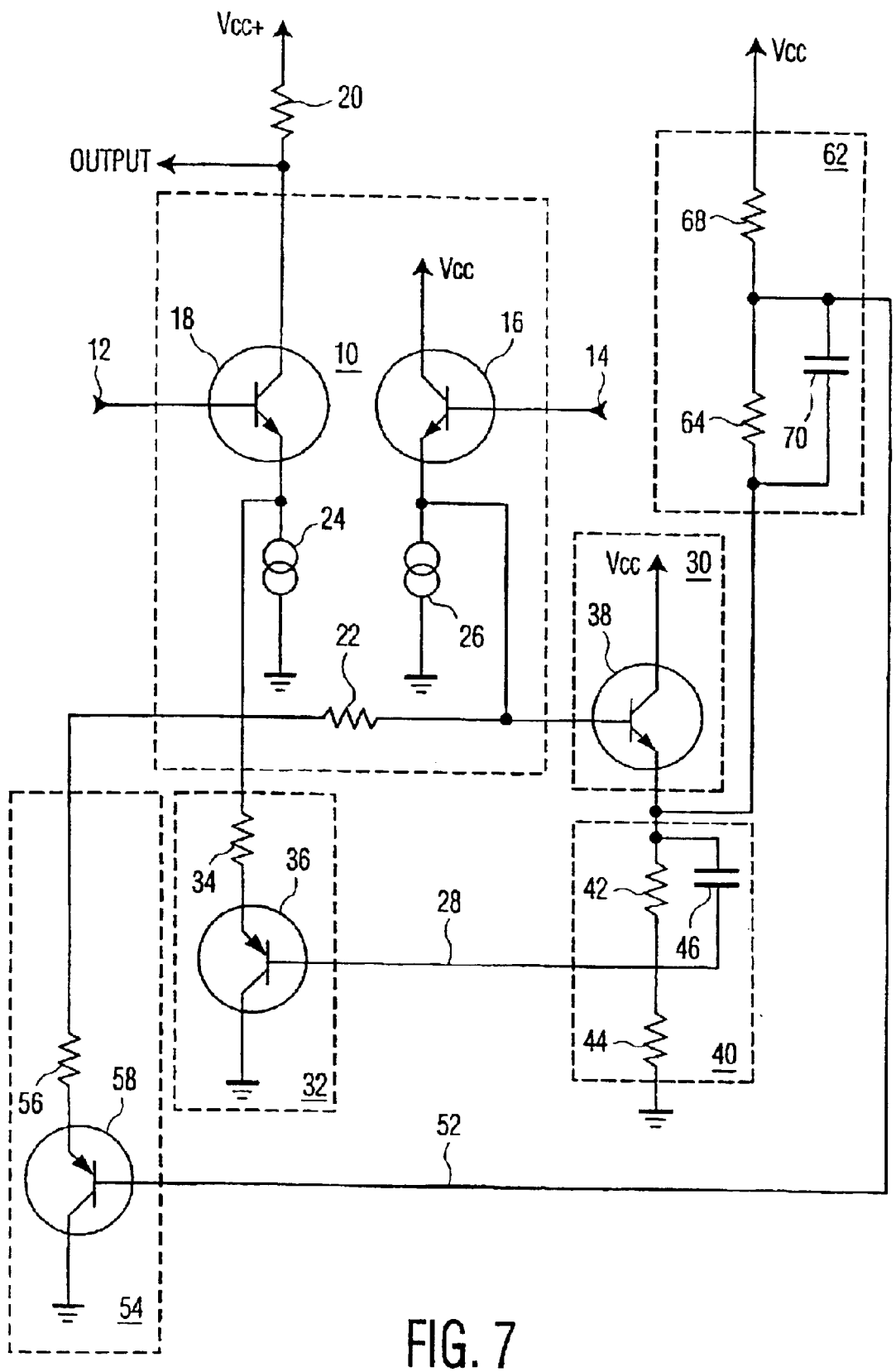
FIG. 7 shows, in schematic diagram form, a signal processing system having three gain regions with inflection points above and below the input common-mode bias point and the gain in the second and third gain regions each being successively higher gain than the gain in the first region.

The embodiment of FIG. 7 will provide two successively increasing gain regions for increasing input signal levels, these gain regions being as characterized in the description of the circuit of FIG. 5. The inflection points in the circuit of FIG. 7 are both above and below the input common-mode bias level, the lower inflection point being determined by the threshold value signal 28 and the higher being determined by the threshold value 52, determined by the divider point of an additional divider network 62 comprised of resistors 64 and 68. Here again bypass capacitor 70 is added to assure the un-attenuated time variant common-mode variation appears at the input 52 to non-linear network 54.

Figure 8:
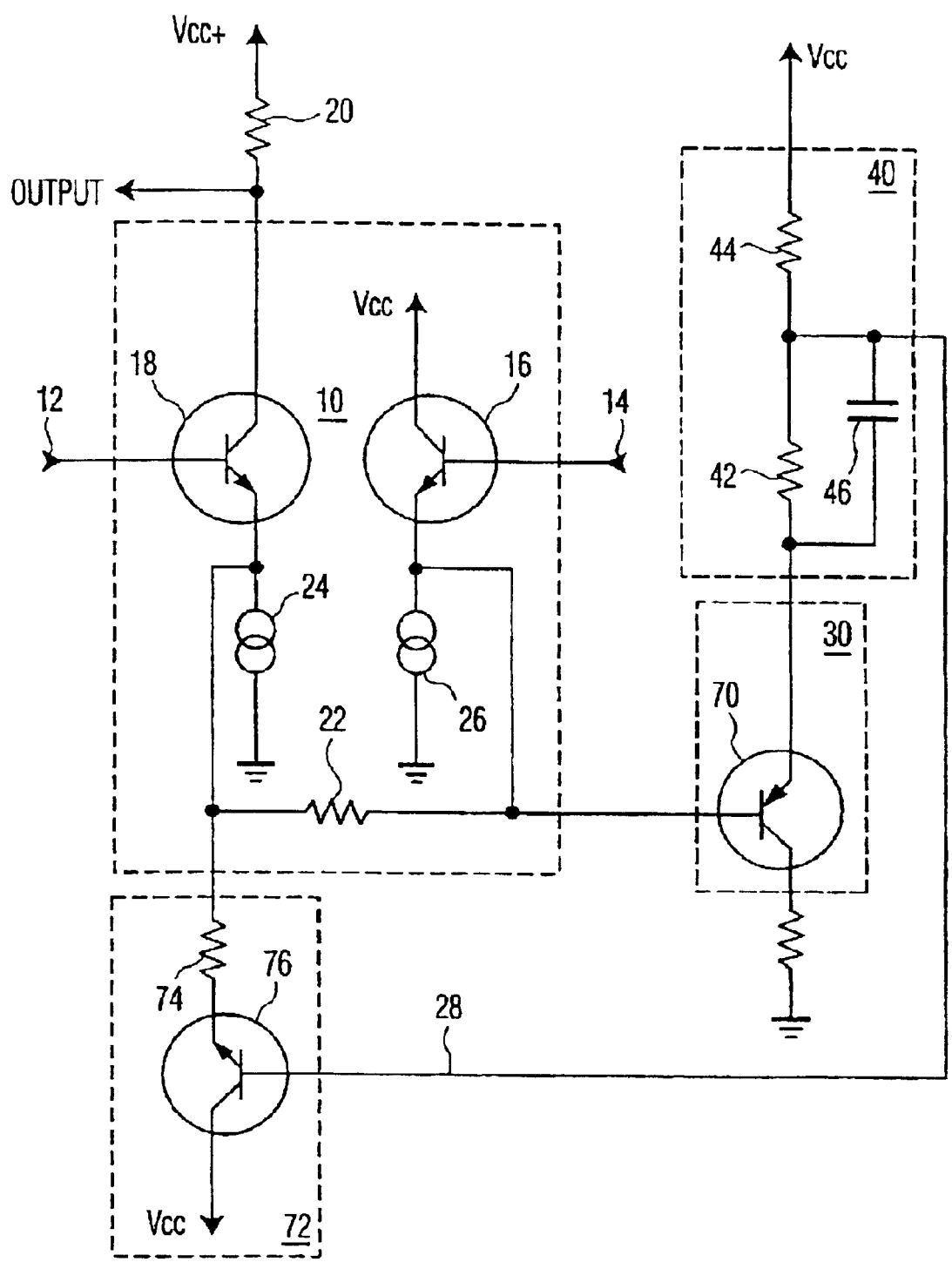
FIG. 8 shows, in schematic diagram form, a signal processing system having two gain regions with an inflection point above the input common-mode bias point and the gain in the second gain region being lower than the gain in the first region.

The signal processing system embodiment shown in FIG. 8 will provide a non-linear characteristic having a single inflection point which is above the level of the input common-mode voltage. In this case, non-linear network 72, comprising an NPN transistor 76, is employed and buffer 30 employs transistor 70, a PNP, to provide threshold value signal 28 to non-linear network 72. Operation is similar to previous examples except that transistor 76 is biased into conduction at lower levels of input time variant signal voltage, thus providing amplifier 10 with a gain determined by the ratio of resistor 20 to the parallel combination of resistors 22 and 74. As the input signal increases beyond the threshold value 28 set by divider network 40, transistor 76 is biased off and the gain of amplifier 10 is determined by the ratio of resistors 20 and 22. In this way a non-linear characteristic determined which has a reduced gain for input signals above a threshold which is at or higher than the input common-mode bias level.

Figure 9:
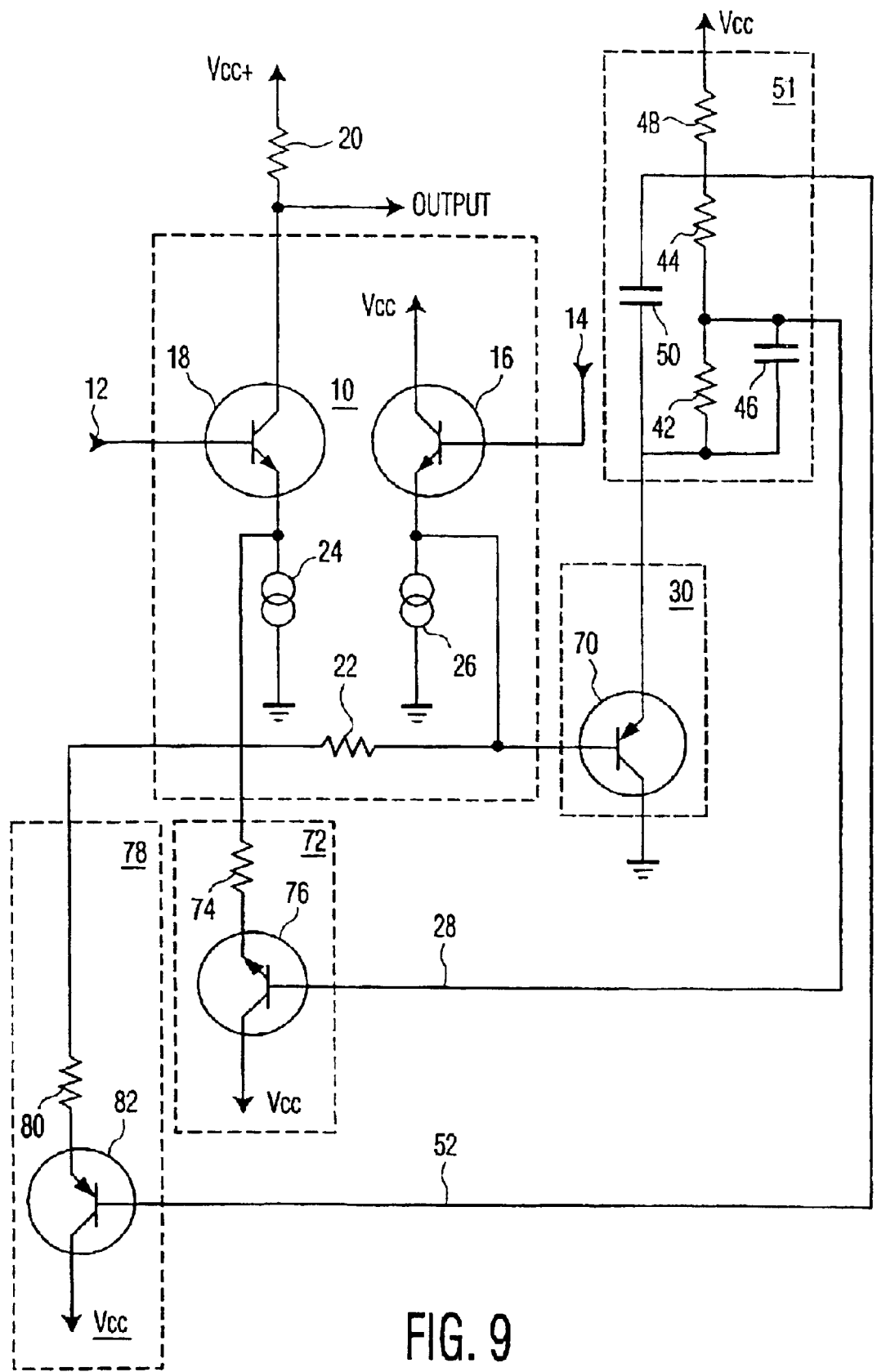
FIG. 9 shows, in schematic diagram form, a signal processing system having three gain regions with two inflection points both above the input common-mode bias point and the gain in the second and third gain regions each being successively lower than the gain in the first region.

In a manner similar to the embodiments described above, the embodiment shown in FIG. 9 provides two successively reduced gain regions, both of which occur above the level of the input common-mode bias voltage. For the lowest values of time variant voltage input both transistors 76 and 82 are conducting and the gain of amplifier 10 is determined by the ratio of resistor 20 to the parallel combination of resistors 22, 74 and 80. At a level of time variant signal 12 above threshold value signal 28 transistor 76 becomes non-conductive and the gain of amplifier 10 is determined by the ratio of resistor 20 to the parallel combination of resistors 22 and 80. At a yet higher level of time variant signal 12 determined by threshold value 52, transistor 82 becomes non-conductive and the gain of amplifier 10 becomes determined by the ratio of resistors 20 and 22.

Figure 10:
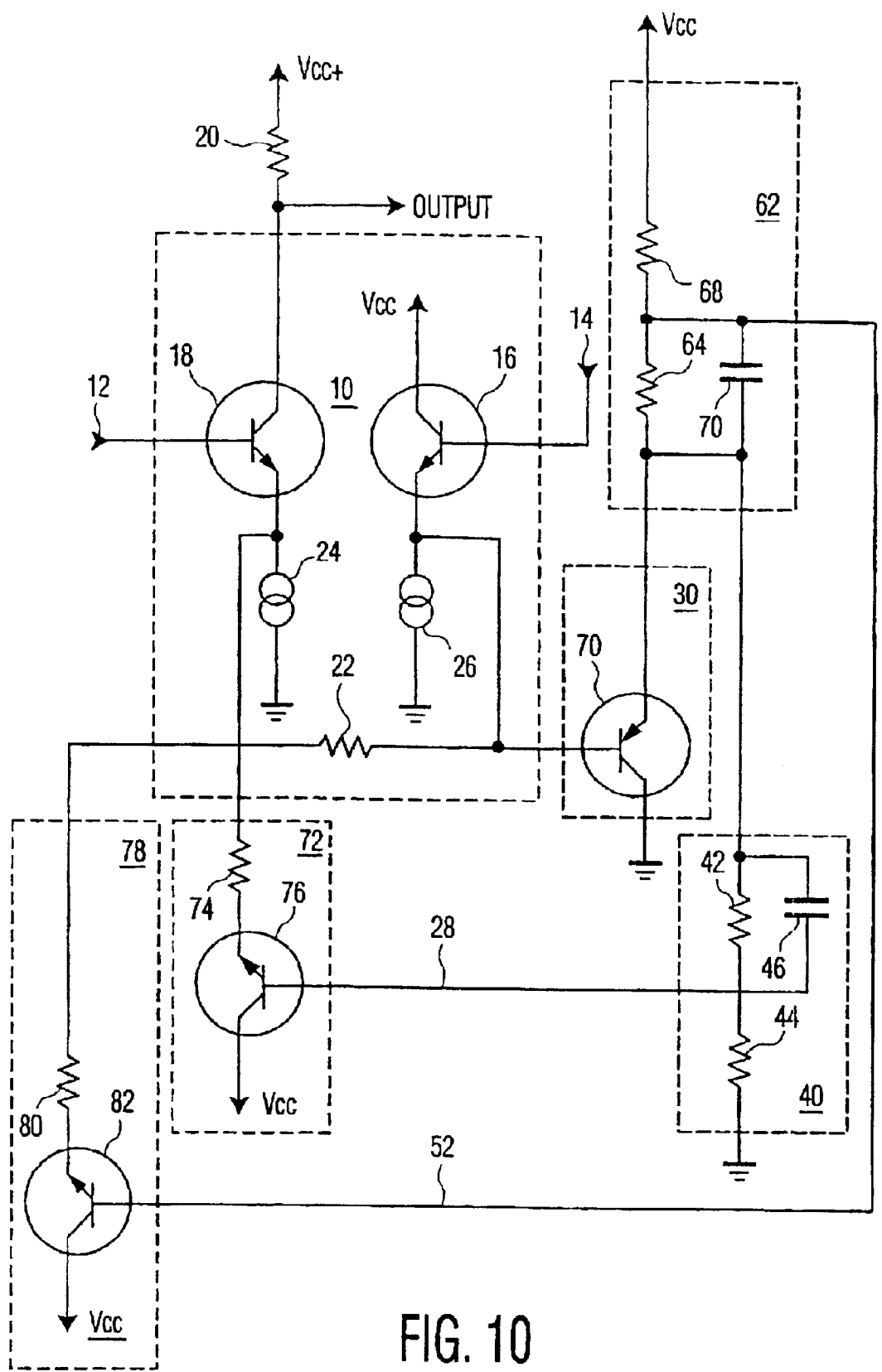
FIG. 10 shows, in schematic diagram form, a signal processing system having three gain regions with inflection points above and below the input common-mode bias point and the gain in the second and third gain regions each being successively lower than the gain in the first region.
Figure 11:
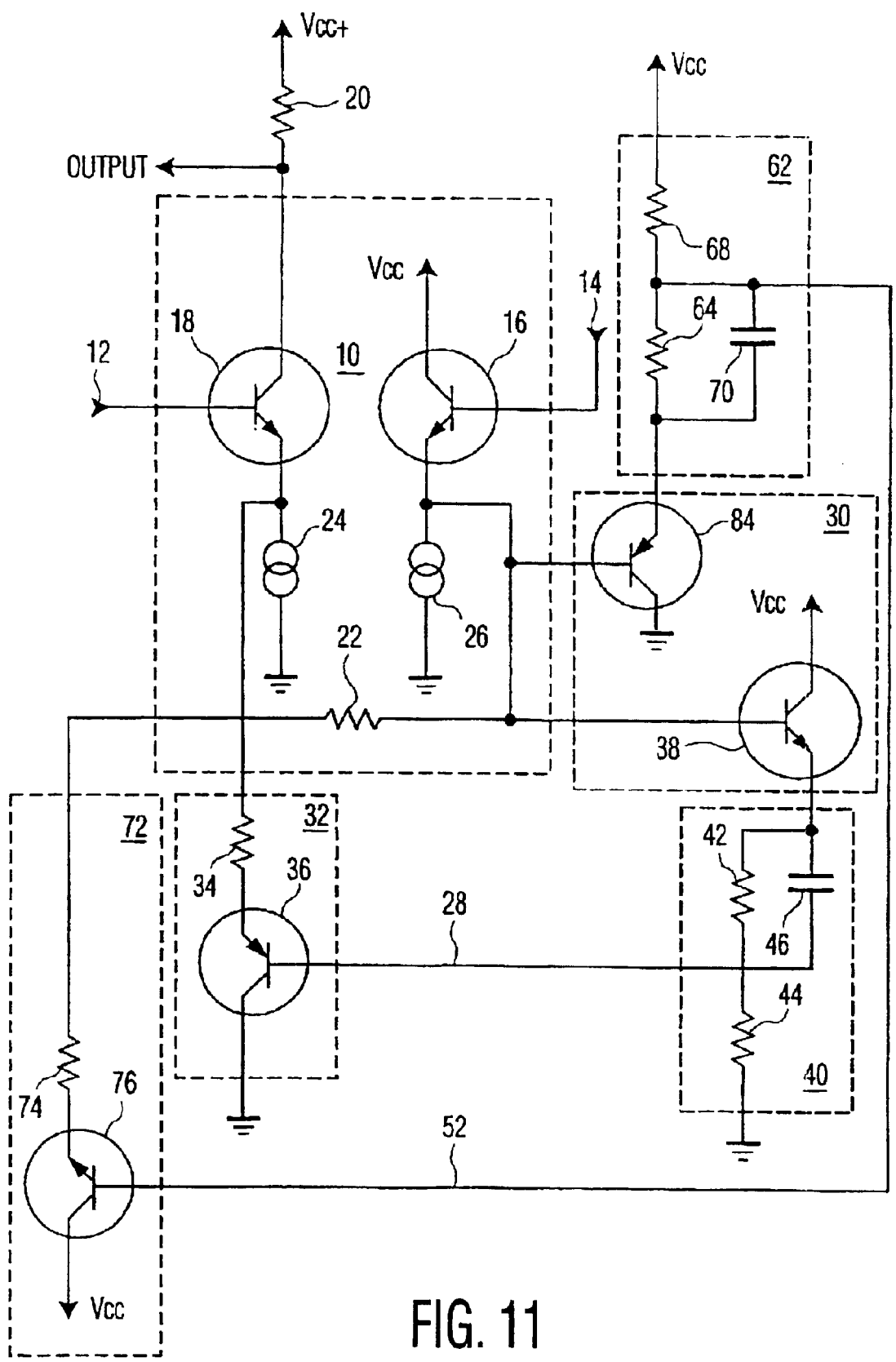
FIG. 11 shows, in schematic diagram form, a signal processing system having three gain regions with inflection points above and below the input common-mode bias point and the gain in the second region being higher than the gains in either the third or the first regions.

The embodiment shown in FIG. 10 provides two successively reduced gain regions, one starting below and one starting above the input common-mode bias level, as determined by threshold value signals 28 and 52 respectively; while the embodiment of FIG. 11 provides an inflection point, determined by threshold value signal 28, which is below the input common-mode bias voltage and provides a transition from a region of relatively lower gain to a region of relatively higher gain, then a second inflection point, determined by threshold value signal 52, which is above the input common-mode bias level and provides a transition from a region of relatively higher gain to one having a relatively lower gain.

Figure 12:
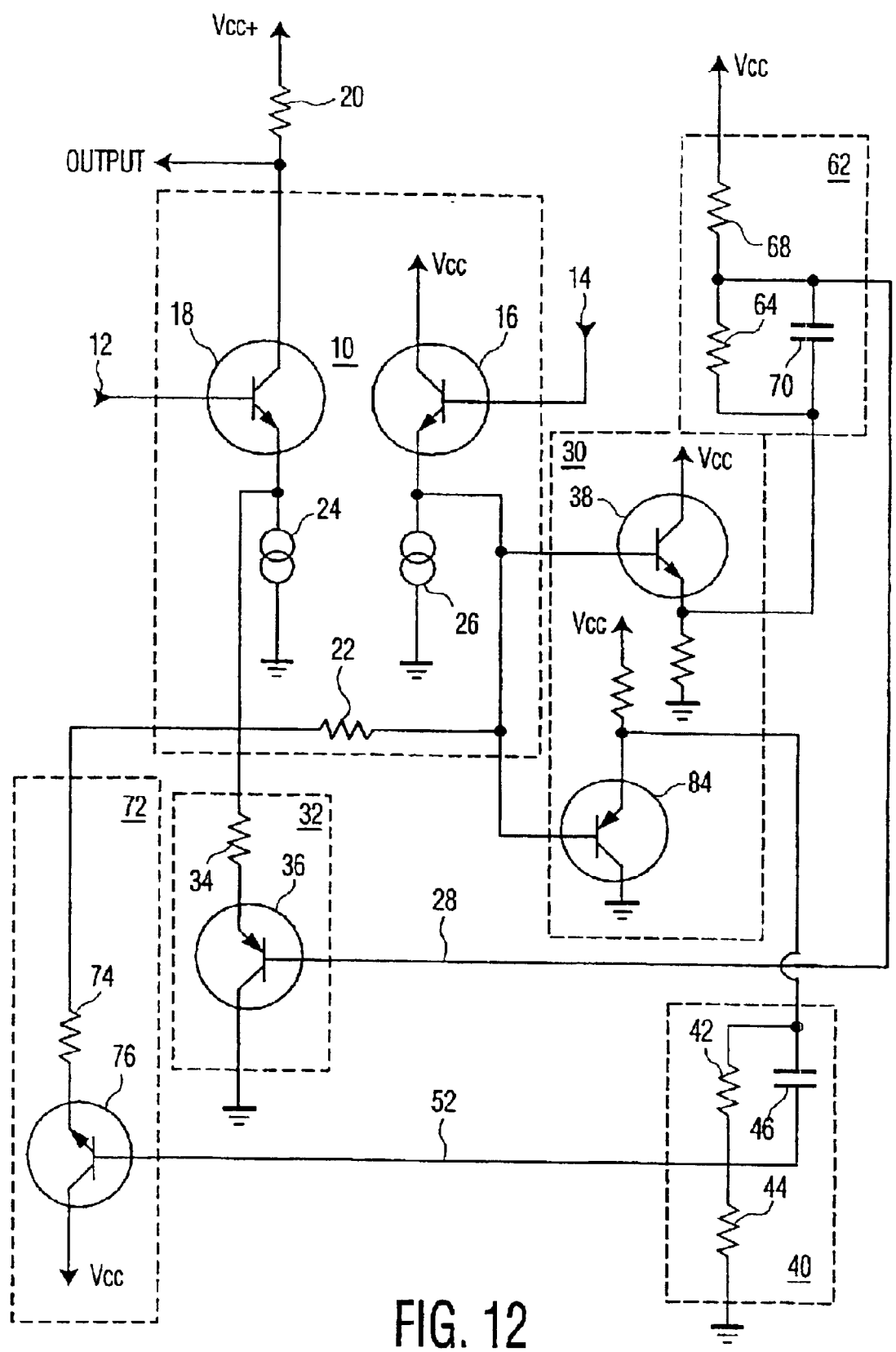
FIG. 12 shows, in schematic diagram form, a signal processing system having three gain regions with inflection points above and below the input common-mode bias point and the gain in the second region being lower than the gains in either the third or the first regions.

The embodiment shown in FIG. 12 provides an inflection point, determined by threshold value signal 52, which is below the input common-mode bias voltage and provides a transition from a first gain to a region of relatively lower gain by causing transistor 76 to become non-conductive, then a second inflection point, determined by threshold value signal 28, which is above the input common-mode bias level and provides a transition to a relatively higher gain, this higher gain being determined by conduction of transistor 36. The gains in the first and third regions may be independently set by the values of resistors 74 and 34 respectively. As in all the other exemplary embodiments shown, optimal temperature tracking is maintained for each non-linear inflection point, by use of PNP/NPN pairs for the buffer and its corresponding non-linear transistor(s).

As described herein, signal processing systems embodying principles of the invention provide for partially differential signaling for inter-stage communication followed by differential amplifier processing of the signal, such processing incorporating means for generating the described non-linear characteristics. By use of a common bias for the signal amplification and the non-linear threshold determination, many sources of noise are eliminated. Selection of semiconductor types and circuit configurations contributes to substantial reduction or elimination of temperature-related variations of the non-linear threshold. Also, non-linear inflection point references track the common-mode component on which the video signal is biased. Such systems also provide first-order temperature compensation for the developed inflection point references, elimination of variation of these inflection point references due to time variant common-mode amplifier input signals, and one or more regions of the signal dynamic range having differing amounts of voltage gain.

Although explicit descriptions of circuits providing one or two non-linear inflection points have been provided, it should be clear that the concepts described can be expanded to provide any number of regions of increased and decreased gain having inflection points located anywhere within the input signal's dynamic range. Also, although described in the context of television signal processing systems, it will be apparent to one skilled in the art that the described principles of the invention are applicable to other types of signal processing systems that involve non-linear processing.

What is claimed is:

1. A non-linear processor, comprising:
   a processor for amplifying a partially differential signal, said partially differential signal comprising a time-variant signal and a common-mode bias, and for rejecting a time-variant common-mode signal imposed upon said partially differential signal;
   means for establishing a threshold level representative of said common-mode bias;
   means for altering the gain of said processor in response to a predetermined relationship existing between said time-variant signal and said threshold level such as to provide said processor a non-linear transfer function; and
   means for substantially preventing said time-variant common-mode signal from modifying said predetermined relationship.

2. Non-linear processor as in claim 1, wherein one or more of said means for altering the gain are employed and produce a gain alteration from a first region gain to a region of relatively higher gain.

3. Non-linear processor as in claim 1, wherein one or more of said means for altering the gain are employed and produce a gain alteration from a first region gain to a region of relatively lower gain.

4. Non-linear processor as in claim 1, wherein two or more of said means for altering the gain are employed and produce gain alterations from a first region gain to a second region of relatively lower gain to a third region having relatively higher gain than said second region.

5. Non-linear processor as in claim 1, wherein two or more of said means for altering the gain are employed and produce gain alterations from a first region gain to a second region of relatively higher gain to a third region having relatively lower gain than said second region.

6. Non-linear processor as in claim 1, wherein said threshold values is an attenuated and DC translated representations of said common-mode bias.

7. Non-linear processor as in claim 6, wherein one or more of said threshold values are disposed below the value of said common-mode bias.

8. Non-linear processor as in claim 6, wherein one or more of said threshold values are disposed above the value of said common-mode bias.

9. A method for non-linearly processing signals, comprising the steps of:
processing a partially differential signal comprising a time-variant signal and a common-mode bias for said partially differential signal, said processing to reject a time-variant common-mode signal imposed upon said partially differential signal;
developing a threshold value representative of said common-mode bias;
altering non-linearly said processing of said partially differential signal in response to a predetermined relationship existing between said time-variant signal and said threshold level; and
preventing alterations of said predetermined relationship in response to said time-variant common-mode signal.

10. Apparatus for non-linearly amplifying electrical signals, comprising:
a first input to the base of a first transistor;
a second input to the base of a second transistor;
a first resistor interconnected between the emitters of said first and said second transistors;
the collector of said first transistor connected to a source of DC supply potential adequate to reverse bias the base to collector junction of said first transistor;
the collector of said second transistor connected through a second resistor to a source of DC supply potential adequate to reverse bias the base to collector junction of said second transistor;
an output terminal connected to said second transistor collector at the junction of said second transistor collector and one end of said second resistor;
current sources connected from each of the emitters of said first and said second transistors to a second source of DC supply potential;
a first secondary gain setting resistor connected from the emitter of said second transistor to the emitter of a third transistor, the collector of said third transistor connected to a collector DC supply potential adequate to reverse bias the base to collector junction of said third transistor; and
the base of said third transistor connected to a source of threshold potential.

11. Apparatus as in claim 10, further including a buffer, the input of said buffer being connected to the emitter of said first transistor with the output of said buffer providing said source of threshold potential.

12. Apparatus as in claim 10, further including a buffer, the input of said buffer being connected to the emitter of said first transistor with the output of said buffer driving a resistive divider comprising one or more divider points, one end of said resistive divider being connected to the output of said buffer with the other end of said resistive divider being connected to a source of DC bias potential;
a first divider point of said divider network providing said source of threshold potential; and
a bypass capacitor connected between the output of said buffer and the base of said third transistor.

13. Apparatus as in claim 12, wherein said source of DC bias potential is lower than the DC potential at the output of said buffer.

14. Apparatus as in claim 12, wherein said source of DC bias potential is higher than the DC potential at the output of said buffer.

15. Apparatus as in claim 13, wherein said third transistor is poled such that said third transistor is rendered conductive in response to said signal input to the base of said second transistor exceeding said third transistor base potential.

16. Apparatus as in claim 15, further comprising a second secondary gain setting resistor connected from the emitter of said second transistor to the emitter of a fourth transistor, the collector of said fourth transistor being connected to a collector DC supply potential adequate to reverse bias the base to collector junction of said fourth transistor, the base of said fourth transistor being connected to a second divider point of said resistive divider; and
said fourth transistor being poled such that said fourth transistor is rendered conductive in response to said signal input to the base of said second transistor exceeding said fourth transistor base potential.

17. Apparatus as in claim 15, further comprising a second secondary gain setting resistor connected from the emitter of said second transistor to the emitter of a fourth transistor, the collector of said fourth transistor being connected to a collector DC supply potential adequate to reverse bias the base to collector junction of said fourth transistor, the base of said fourth transistor being connected to a second divider point of said resistive divider; and
said fourth transistor being poled such that said fourth transistor is rendered non-conductive in response to said signal input to the base of said second transistor exceeding said fourth transistor base potential.

18. Apparatus as in claim 13, wherein said third transistor is poled such that said third transistor is rendered non-conductive in response to said signal input to the base of said second transistor exceeding said third transistor base potential.

19. Apparatus as in claim 18, further comprising a second secondary gain setting resistor connected from the emitter of said second transistor to the emitter of a fourth transistor, the collector of said fourth transistor being connected to a collector DC supply potential adequate to reverse bias the base to collector junction of said fourth transistor, the base of said fourth transistor being connected to a second divider point of said resistive divider; and
said fourth transistor being poled such that said fourth transistor is rendered conductive in response to said signal input to the base of said second transistor exceeding said fourth transistor base potential.

20. Apparatus as in claim 18, further comprising a second secondary gain setting resistor connected from the emitter of said second transistor to the emitter of a fourth transistor the collector of said fourth transistor being connected to a collector DC supply potential adequate to reverse bias the base to collector junction of said fourth transistor, the base of said fourth transistor being connected to a second divider point of said resistive divider; and
said fourth transistor being poled such that said fourth transistor is rendered non-conductive in response to said signal input to the base of said second transistor exceeding said fourth transistor base potential.

* * * * *